United States Patent [19]

Nagahama

[11] 4,085,374

[45] Apr. 18, 1978

[54] GENERATOR FOR GENERATING CONTROL VOLTAGE WAVEFORM

[75] Inventor: Yasuo Nagahama, Hamamatsu, Japan

[73] Assignee: Nippon Gakki Seizo Kabushiki Kaisha, Japan

[21] Appl. No.: 756,351

[22] Filed: Jan. 3, 1977

[30] Foreign Application Priority Data

Jan. 12, 1976 Japan .................................... 51-2593
Mar. 5, 1976 Japan ............................ 51-26133[U]

[51] Int. Cl.[2] ......................... G10H 5/10; H03K 17/60

[52] U.S. Cl. ...................................... 328/143; 328/14; 307/246; 307/294; 84/1.13; 84/1.26; 84/DIG. 23

[58] Field of Search ................. 307/294, 246; 84/1.13, 84/1.26, DIG. 23; 328/142, 143, 14

[56] References Cited

U.S. PATENT DOCUMENTS

| | | | |
|---|---|---|---|
| 3,848,142 | 11/1974 | Adachi | 307/294 |
| 3,886,836 | 6/1975 | Hiyoshi | 84/1.13 |
| 3,952,624 | 4/1976 | Kawakami | 84/1.13 |
| 4,028,978 | 6/1977 | Okamoto | 84/1.26 |

*Primary Examiner*—John S. Heyman
*Attorney, Agent, or Firm*—Flynn & Frishauf

[57] ABSTRACT

A control voltage waveform generator is provided with a voltage-controlled variable resistor, a storage capacitor forming a time constant circuit together with the resistor, a plurality of voltage signal sources, and a plurality of time constant determining voltage signal sources. The voltage signal sources are sequentially coupled to the storage capacitor through the voltage-controlled variable resistor, and the time constant determining voltage signal sources are sequentially coupled to the control input of the voltage-controlled variable resistor.

12 Claims, 7 Drawing Figures

SUBTRACTOR 54 (55)

GENERATOR FOR GENERATING CONTROL VOLTAGE WAVEFORM

BACKGROUND OF THE INVENTION

The present invention relates to a generator for generating a control voltage waveform which may be used in, for example, a synthesizer type electronic musical instrument.

The synthesizer type electronic musical instrument as shown in FIG. 1 has been well known in the field of electronic musical instrument. A keyboard circuit designated by reference numeral 11 generates a pitch determining voltage signal having a magnitude corresponding to the note of a key being depressed on the keyboard, and a trigger signal which represents the key depression and sustains from key depression to key release. The pitch determining voltage signal is coupled to a voltage-controlled frequency-variable oscillator 12 (hereinafter referred to as VCO) to produce the tone signal corresponding to the note of the key being depressed on the keyboard. The tone signal from VCO 12 is fed to a voltage-controlled characteristic-variable filter 13 (hereinafter referred to as VCF) for audio spectrum modification. VCF 13 also is connected to the keyboard circuit 11 and is controlled to have a characteristic frequency dependent on the magnitude of the pitch determining voltage signal. The tone signal from VCF 13 is applied to a voltage-controlled gain-variable amplifier 14 (hereinafter referred to as VCA) for the envelope control. The output from VCA14 is sent out to a sound production system (not shown) including a power amplifier and a loudspeaker. VCO 12, VCF 13 and VCA 14 are coupled with control voltage generators 15, 16 and 17, respectively, for controlling the oscillation frequency, the characteristic frequency and the voltage gain in accordance with the waveform of the control voltage. Upon receipt of a trigger signal from the keyboard circuit 11, the control voltage generators 15, 16 and 17 start to generate control voltages with a waveform as shown in FIG. 2.

As shown in FIG. 2, as the key is depressed on the keyboard, the control voltage starts to rise from an initial level or a first level to an attack level or a second level in an attach time dependent on a first time constant. At the instant that the control votlage reaches the attack level, it decays to a sustain level or a third voltage level in a first decay time dependent on a second time constant and the sustain level sustains until the key is released. At the key release, the sustain level starts to decay to the initial level in a second decay time dependent on a third time constant.

A parameter controlling voltage generator 18 generates parameter controlling voltage signals which are coupled to the control voltage generator to determine the initial level, the attack level, and the sustain level, and the attack time and the first and second decay times of the control voltage. A prior art control voltage generator is desclosed in U.S. Pat. No. 3,886,836 issued to Teruo Hiyoshi and assigned to the same assignee as the present application. The prior art generator uses a plurality of time contstant circuits each having a voltage-controlled variable resistor in order to form a waveform as shown in FIG. 2 in response to the parameter control voltage signals. This results in complexity of the circuit construction of the control voltage generator.

SUMMARY OF THE INVENTION

Accordingly, an object of the present invention is to provide a control voltage generator with a simple circuit construction.

According to the present invention, the object is achieved by a control voltage generator comprising: a voltage-controlled variable resistor means; a storage means forming a time constant circuit together with the variable resistor means; first voltage signal sources; second voltage signal sources for providing voltage signals to determine time constants of the time constant circuit; first coupling means for sequentially coupling the first voltage signal sources to the storage means via the voltage-controlled vairable resistor means; and second coupling means for sequentially coupling the second voltage signal sources to the cotnrol input of the voltage-controlled variable resistor means.

Other objects and features of the present invention will be apparent form the following description taken in connection with the accompanying drawing, in which:

DETAILED DESCRIPTION OF THE PREFERRED EMBODIMENTS

The present invention will be described for the generator of the control voltage waveform in the synthesizer type elctronic musical instrument.

Figure 3:
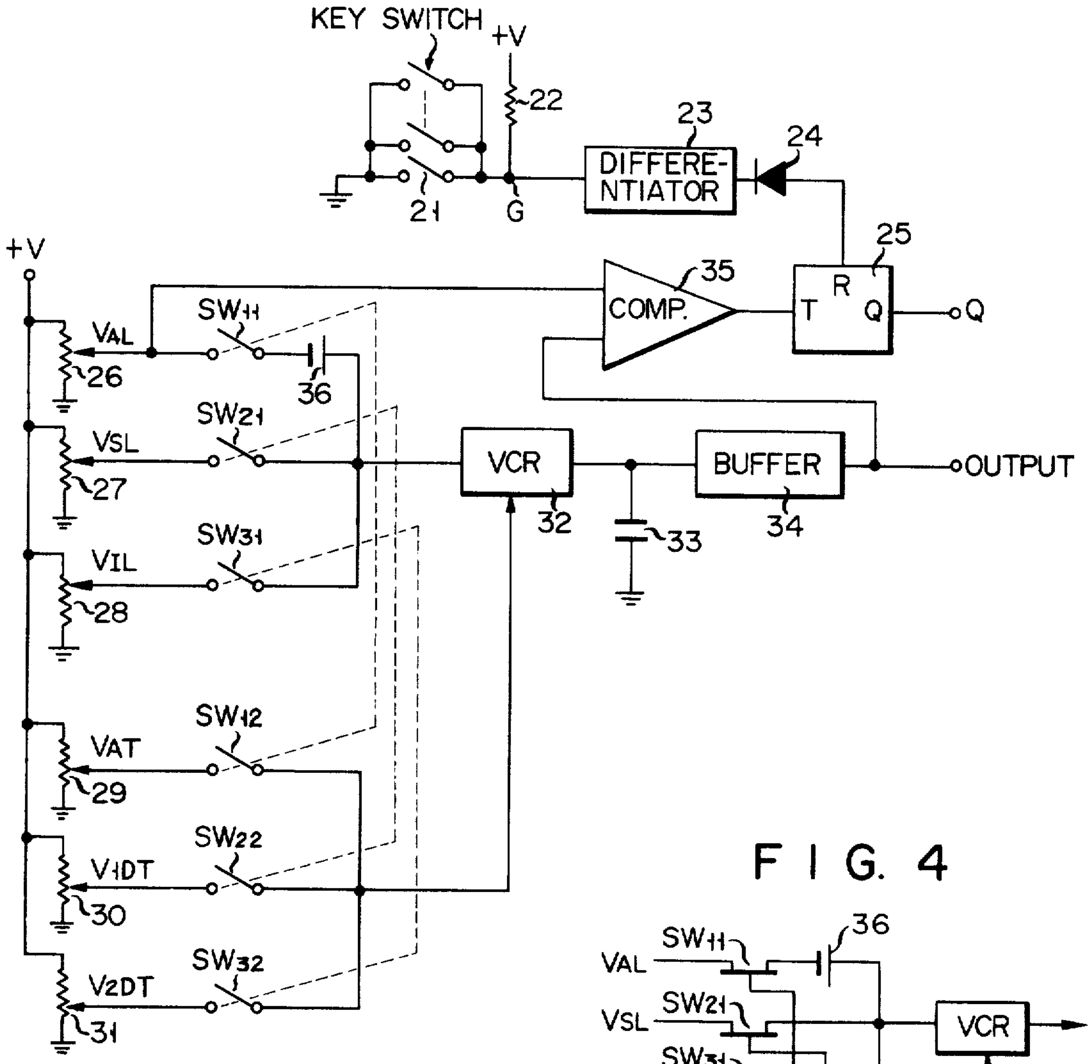
FIG. 3 shows an embodiment of a cotnrol voltage waveform generator according to the present invention.

Reference will be made to FIG. 3 illustrating an embodiment of a cotnrol votlage waveform generator according to the present invention. In the figure, reference numeral 21 designates a number of key switches which are actuated by the corresponding keys on the keyboard, respectively. One ends of the respective key switches are grounded while the other ends thereof are connected to a positive potential source +V through a resistor 22, thereby to constitute an instruction signal source for control waveform formation. The output G of the instruction signal source is coupled with the reset input R of a T-type flip-flop circuit 25 through a differentiator 23 and a diode 24. The instruction signal source produces at the output G a logical 1 level signal (+V) in a normal condition and a logical 0 level signal (0V) when a key on the keyboard is actuated. Accordingly, upon actuation of the key i.e. upon close of the key switch, the flip-flop circuit 25 is reset and thus the output Q thereof beocmes logical 0 level. When a set signal is applied to the trigger terminal T, the flip-flop circuit 25 produces at the output Q the logical 1 level signal.

The flip-flop circuit 25 normally produces the logical 1 level signal at the output Q.

Figure 1:
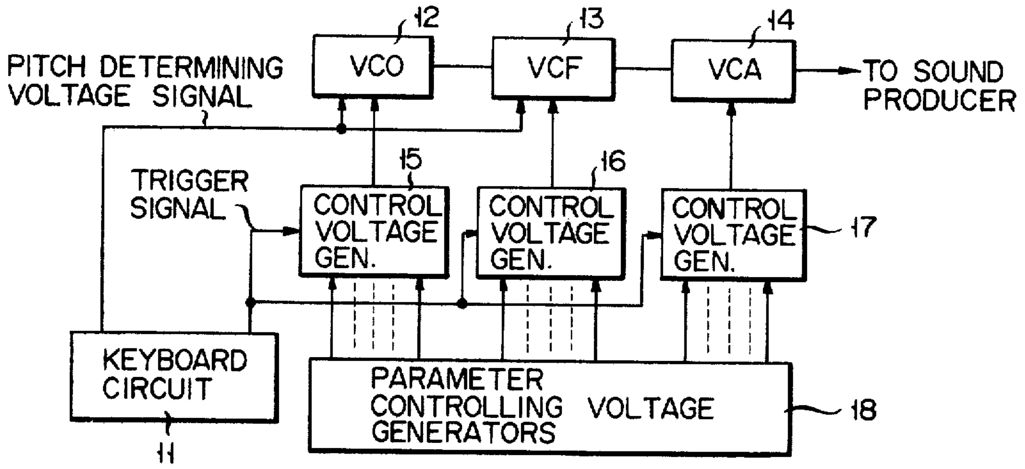
FIG. 1 PRIOR ART
FIG. 1 shows a block diagram of a prior art synthesizer type electronic musical instrument.
Figure 2:
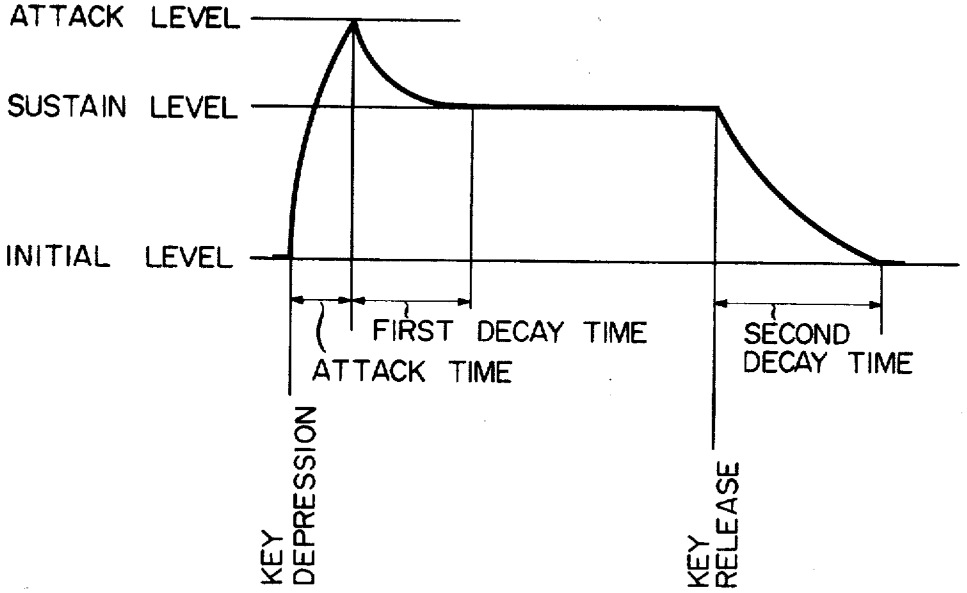
FIG. 2 PRIOR ART
FIG. 2 illustrates a waveform of control voltages used in the electronic musical instrument of FIG. 1.

Potentiometers 26 to 31 connected across a DC power source constitute the parameter controlling voltage generators 18 shown in FIG. 1. A group of potentiometers 26 to 28 provide voltage signals $V_{AL}$, $V_{SL}$ and $V_{IL}$ for determining the attack level, the sustain level, and the initial level of the control voltage waveform signal to be formed. Another group of potentiometers 29, 30 and 31 provide voltage signals $V_{AT}$, $V_{1DT}$ and $V_{2DT}$ for determining the attack time, the first decay time and the second decay time of the control voltage waveform.

The voltage signals $V_{AL}$, $V_{SL}$ and $V_{IL}$ are coupled to the input of a voltage-controlled variable resistor (hereinafter referred to as VCR) 32 through electronic or mechanical switches $SW_{11}$, $SW_{21}$ and $SW_{31}$. The voltage control signals $V_{AT}$, $V_{1DT}$ and $V_{2DT}$ are coupled to the control input of VCR 32 through electronic or mechanical switches $SW_{12}$, $SW_{22}$ and $SW_{32}$. With the output of VCR 32 is connected a storage capacitor 33 which forms a time constant circuit together with VCR 32. The resistance between the input and output of VCR 32 depends on the magntude of a voltage signal at the control input of VCR 32. As shown in the figure, each pair of switches $SW_{11}$ and $SW_{12}$, $SW_{21}$ and $SW_{22}$, and $SW_{31}$ and $SW_{32}$, respectively, are ganged to each other.

Each pair of switches are actuated under the following conditions for the output G of the waveform signal formation instruction signal source and the output Q of the flip-flop circuit 25.

$$SW_{11}, SW_{12} \ldots \bar{G} \cdot \bar{Q} = 1$$

$$SW_{21}, SW_{22} \ldots Q \cdot \bar{G} = 1$$

$$SW_{31}, SW_{32} \ldots G \cdot Q = 1$$

In other words, the switches $SW_{11}$ and $SW_{12}$ are actuated when the outputs Q and G are at logical 0 level, and the switches $SW_{21}$ and $SW_{22}$ are actuated when the output Q is at logical 1 level and the output G is at logical 0 level, and the switches $SW_{31}$ and $SW_{32}$ are actuated when both the outputs G and Q are at logical 1 level.

The control votlage waveform being formed in the storage capacitor 33 is taken out through a high input impedance buffer circuit 34. The voltage signal $V_{AL}$ and the output of buffer circuit 34 are coupled to the inputs of a voltage comparator 35 whose output is connected with the trigger input of the flip-flop circuit 25. A compensation power source 36 connected between the $V_{AL}$ voltage source 26 and the input of VCR 32 is proivded to ensure that the maximum voltage across the storage capacitor 33 exceedss the voltage $V_{AL}$. When no compensation power source is provided, the capacitor voltage fails to reach the voltage $V_{AL}$. The compensation power source 36 is extremely low in voltage.

The explanation to follow is the operation of the control voltage waveform generator of FIG. 3. In a normal condition, i.e. when the key is not depressed, both the outputs G and Q are at logical 1 level, and thus both the switches $SW_{31}$ and $SW_{32}$ are closed. As a result, the initial level signal source 28 is coupled to the capacitor 33 through VCR 32, giving the initial level of the control voltage waveform across the capacitor. In this example of FIG. 3, a positive voltage is used for the initial voltage signal, but a negative or zero voltage may be employed.

When a key is depressed on the keyboard, both the outputs G and Q become logical 0 level and thus the switches $SW_{11}$ and $SW_{12}$ are now closed, as seen from the switch operation condition mentioned above. At this time, the switches $SW_{31}$ and $SW_{32}$ become opened. Under this condition, the voltage signal $V_{AL}$ is coupled to the storage capacitor 33 through VCR 32. The capacitor voltage increases form the initial level to the attack level in accordance with a time constant defined by the resistance of VCR 32 and the capacitance of capacitor 33. The time constant at this time depends on the voltage control signal $V_{AT}$ since the resistance of VCR 32 is dependent on the voltage control signal $V_{AT}$. When the capacitor voltage exceeds $V_{AL}$ by virtue of the compensation voltage source 36, the comparator 35 produces an output which in turn triggers the flip-flop 25 to provide logical 1 level signal at the output Q. At this time, G = 0 and Q = 1 and thus the switches $SW_{21}$ and $SW_{22}$ are both closed. The result is that the voltage $V_{SL}$ is coupled to the input of VCR 32 and the voltage $V_{1DT}$ to the control input of $VCR_{32}$. With $V_{AL} > V_{SL}$, the capacitor 33 discharges from $V_{AL}$ to $V_{SL}$ in accordance with the time constant dependent on the voltage $V_{1DT}$. Thereafter, the capacitor 33 keeps the voltage $V_{SL}$ until the key is released. Upon the key release, the output G beocmes the logical 1 level while the output Q remains its logical 1 state. Accordingly, the switch operation condition is G.Q = 1 and hence the switches $SW_{31}$ and $SW_{32}$ are both closed. Through the closure of these switches, the voltage $V_{IL}$ is applied to the input of VCR 32 and the voltage $V_{2DT}$ to the control input of the VCR 32. Since $V_{SL} > V_{IL}$, the capacitor 33 discharges from $V_{SL}$ to $V_{IL}$ in accordance with a time constant dependent on the magnitude of $V_{2DT}$.

Figure 4:
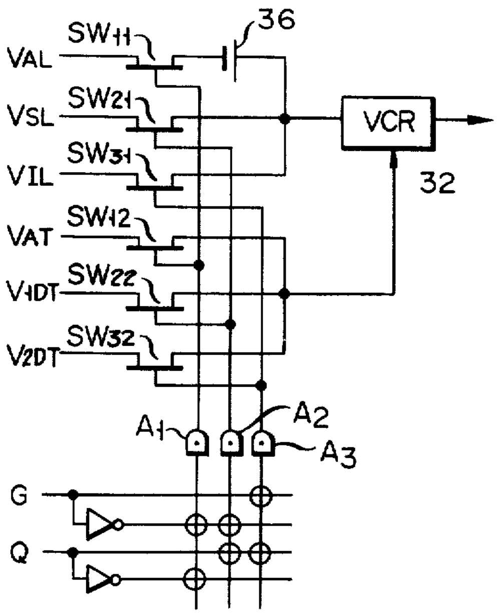
FIG. 4 shows an example of a switch circuit used in the control voltage waveform generator of the present invention.

Turning to FIG. 4, there is shown a circuit diagram of a switch control circuit for controlling in response to the outputs of G and Q, the switches $SW_{11}$, $SW_{21}$, $SW_{31}$, $SW_{12}$, $SW_{22}$ and $SW_{32}$. In the circuit, the respective switches are comprised of field effect transistors. Other components may be used in lieu of FET's. The output of an AND gate $A_1$ receiving the logical signals $\bar{G}$ and $\bar{Q}$ is coupled with the control or gate electrodes of switches $SW_{11}$ and $SW_{12}$. The output of an AND gate $A_2$ receiving the logical signals $\bar{G}$ and Q is coupled with the control or gate electrodes of switches $SW_{21}$ and $SW_{22}$. The output of an AND gate $A_3$ for the logical signal G and Q is coupled with the gate or control electordes of switches $SW_{31}$ and $SW_{32}$.

The voltage-controlled variable resistor in the control voltage waveform generator of the invention may be such a known device as includes a field effect transistor. An example of the voltage-controlled variable resistor which is suitable for the control voltage waveform generator of the present invention, will be described hereinafter with reference to FIG. 5. In the figure, reference numerals 51, 52 and 53 designate input, output and control terminals. Reference numerals 54 and 55 designate a high input impedance subtraction circuits for producing the difference voltage $Vo-Vi$ and $Vi--Vo$ where $Vo$ is a voltage at the output 52 and $Vi$ a voltage at the input 51. A voltage-controlled conductance-variable voltage-to-current converter 56 is provided between the subtraction circuit 54 and the input terminal 51 and another voltage-controlled conductance-variable voltage-to-current vonverter 57 is connected between the subtraction circuit 55 and the output terminal 52. When the input voltage V*i* is higher than the output voltage V*o*, the input current I*i* flows into the voltage-to-current converter 56 through the input terminal 51 and at the same time the output current I*o* equal to the input current I*i* flows out of the voltage-to-current converter 57 through the output terminal 52. On the other hand, when the output voltage V*o* is higher than the input voltage V*i*, the output current I*o*' flows into the voltage-to-current vonverter 57 through the output terminal 52 and at the same time the input current I*i*' equal to the output current I*o*' flows out of the converter 56 to the input terminal 51. With such an operation of the device, it apparently acts as a resistor. It will be apparent that, if the output current ic (I*i*, I*o*; I*i*', I*o*') of the voltage-to-current converters 56 and 57 depends on the control voltage V*c* at the control terminal 53, the above-mentioned voltage-controlled resistor also is operable as a variable resistor. The apparent resistance R of the voltage controlled resistor is given $$R = 1/g = |Vi - Vo|/ic$$

where $g$ is conductance of each of voltage-to-current converters 56 and 57 and $ic = Ii = Io$.

Figure 6:
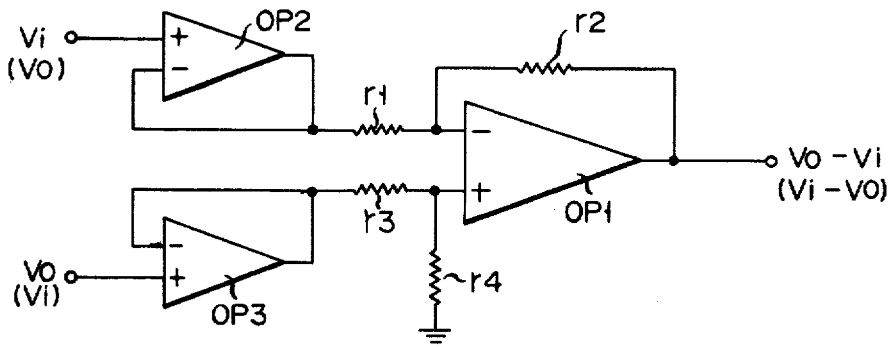
FIG. 6 shows an example of the substractor in FIG. 5.

Although the known subtraction circuit may be used for the subtraction circuit, a subtraction circuit as shown in FIG. 6 is preferable to provide a high input impedance. A feedback resistor $r_2$ is connected between the output and the inverting input of an operational amplifier $OP_1$ whose noninverting input is connected to ground through a resistor $r_4$. An operational amplifier $OP_2$ receiving at the noninverting input the voltage V*i* or V*o* and whose inverting input and output are short circuited, is connected with the inverting input of the operational amplifier $OP_1$ through a resistor $r_1$. Another operational amplifier $OP_3$ receiving at the noninverting input the voltage V*o* or V*i* and whose inverting input and output are short circuited, is connected with the noninverting input of the operational amplifier $OP_1$ through a resistor $r_3$.

Figure 7:
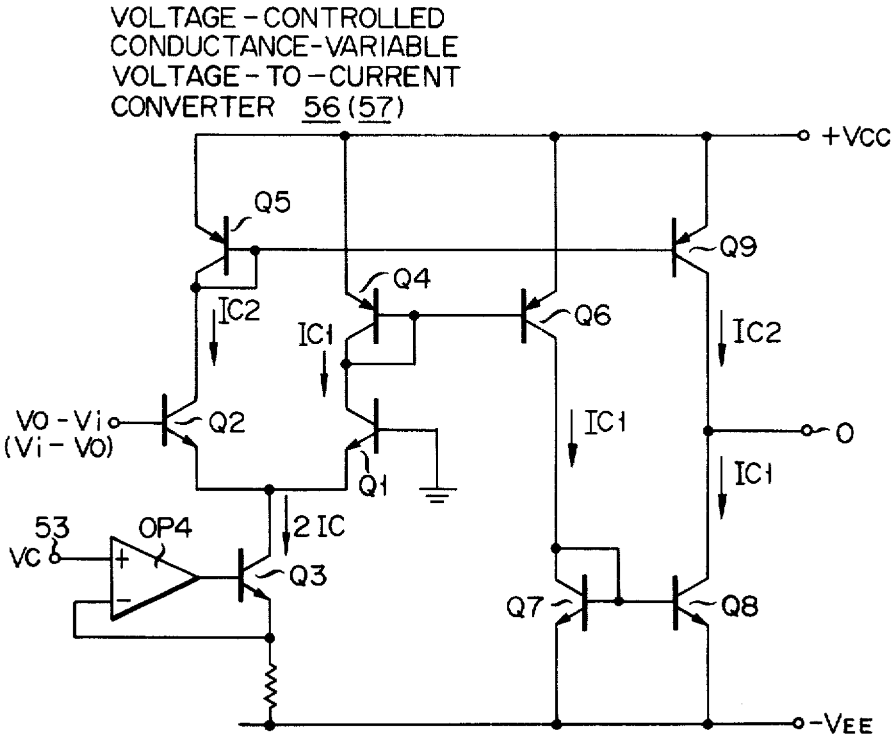
FIG. 7 shows a sechematic circuit diagram of a voltage-controlled conductance-variable voltage-to-current converter in FIG. 5.

Reference is made to FIG. 7 illustrating a schematic circuit diagram of a voltage-controlled conductance-variable voltage-to-current converter. The control voltage V*c* is coupled through an operational amplifier $OP_4$ with the base of a constant current transistor $Q_3$ whose collector is connected to the emitters of differential transistors $Q_1$ and $Q_2$. The current 2I*c* flowing through the transistor $Q_3$ depends on the control voltage V*c* and substantially equals the sum of the collector currents Ic1 and Ic2 of the differential transistors $Q_1$ and $Q_2$. The base of transistor $Q_1$ is grounded and the base of the transistor $Q_2$ is connected to receive the input voltage V*i*−V*o* or V*o*−V*i*. The current Ic1 flows through a transistor $Q_6$ constituting a current mirror for a transistor $Q_4$ connected to the collector of transistor $Q_1$. The current Ic1 also flows through a transistor $Q_8$ constituting a current mirror for a transistor $Q_7$ connected to the collector of transistor $Q_6$. The current Ic2 flows through a transistor $Q_9$ constituting a current mirror for a transistor $Q_5$ connected to the collector of transistor $Q_2$. The collectors of the transistors $Q_8$ and $Q_9$ are connected with an output terminal O.

Figure 5:
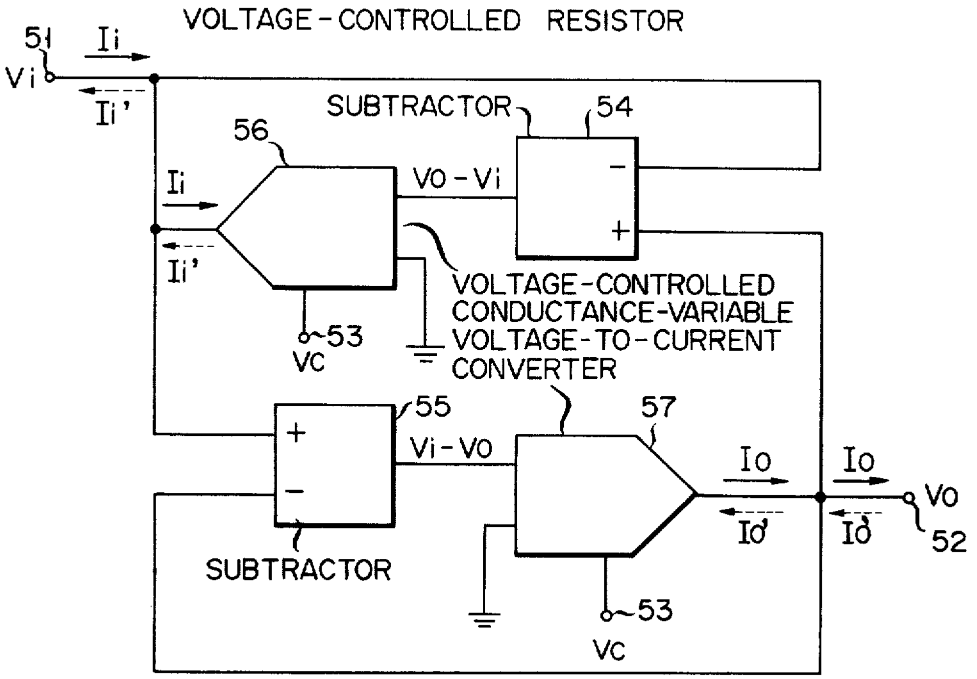
FIG. 5 shows a block diagram of a voltage-controlled variable resistor which may be employed as that of FIG. 3.

In the case of the voltage-to-current converter 56, the output terminal O is connected with the input terminal 51 in the circuit of FIG. 5, and the base of transistor $Q_2$ is coupled with the output voltage V*o*−V*i* of the subtractor 54. In the voltage-to-current vonverter 57, the output terminal O is connected to the output terminal 52 of FIG. 5 and the base of transisotr $Q_2$ is coupled with the output voltage V*i*−V*o* from the subtractor 55.

When the input voltage V*i* of VCR is equal to the output voltage V*o*, Ic1 = Ic2 = I*c* and hence no current flows into or out of the output terminal O. When the input voltage V*i* is higher than the output voltage V*o* the input voltage V*o*−V*i* (<0) is applied to the base of transistor $Q_2$ in the voltage-to-current converter 56 and thus Ic1>Ic2. Accoridngly, a current equal to Ic1−Ic2 flows into the converter 56 through the output terminal O. In the converter 57, on the other hand, the input voltage V*i*−V*o* (>0) is coupled with the base of transistor $Q_2$ and thus Ic2>Ic1. Accordingly, a current corresponding to Ic2−Ic1 flows out of the converter 57 through the output terminal O. In short, when V*i*>V*o*, in the FIG. 5 circuit, the current, $Ii = |Ic1 - Ic2|$, flows into the converter 56 while the current, $Io = |Ic1 - \lambda Ic2|$, flows out of the converter 57.

When the output voltage V*o* is higher than the input voltage V*i*, the difference voltage V*o*−V*i* (>0) is coupled with the base of transistor $Q_2$, in the converter 56 and thus Ic2>Ic1. Accordingly, the current corresponding to Ic2−Ic1 flows out of the converter 56 through the output terminal O. In the converter 57, on the other hand, the base of transistor $Q_2$ is coupled with V*i*−V*o* (<0) and thus Ic1>Ic2. Accordingly, a current corresponding to Ic1−Ic2 flows into the converter 57 through the output terminal O. In other words, in the case of V*i*<V*o* in the FIG. 5 circuit, the current $Ii' = |Ic1 - Ic2|$ flows out of the converter 56 and the current $Io' = |Ic1 - Ic2|$ flows into the converter 57.

Generally, the collector current I*c* of a transistor is expressed by $Ic = Io\,(e^{kV_{BE}} - 1)$, where I*o* is a satuation current, $V_{BE}$ a base-to-emitter voltage of the transistor, and $k$ a proportional constant. The current $ic$ ($= Ic1 - \lambda Ic2$) flowing through the output terminal O of the voltage-to-current converter depends on the input voltage to the base of transistor $Q_2$ and the conductance $gm$ ($= dIc/dV_{BE}$) of the same. When $e^{kV_{BE}} >> 1$, the conductance $gm$ is substantially proportional to the current I*c* and the current I*c* is proportional to the control voltage V*c*. Therefore, VCR of FIG. 5 acts as a resistor through which the current $ic = gm\,|Vi - Vo|$ controlled by the control voltage V*c* flows.

Various other modifications of the disclosed embodiment will be apparent to the person skilled in the art without departing from the spirit and scope of the invention as defined by the appended claims.

What is claimed is:

1. A generator for generating a control voltage waveform whose voltage level varies with time comprising:
   - a voltage-controlled variable resistor means having a control input, an input and an output, the resistance between the input and output of said variable resistor depending on the voltage level at the control input;
   - a storage means coupled with the output of said voltage-controlled variable resistor means for forming a time constant circuit with said variable resistor means and providing said control voltage waveform;
   - first sources of voltage signals;
   - second sources of time constant determing voltage signals;
   - first coupling means for sequentially coupling said first sources to the input of said voltage-controlled variable resistor means; and second coupling means for sequentially coupling said second sources to the control input of said voltage-controlled variable resistor means in synchronism with said first coupling means.

2. A generator according to claim 1, in which said first sources of voltage signals each include a dc voltage supply source and a potentiometer connected across said dc voltage source.

3. A generator according to claim 1, in which said second sources of time constant determining voltage signals each include a dc voltage source and a potentiometer connected across said dc voltage source.

4. A generator according to claim 1, in which said voltage-controlled variable resistor means includes first and second voltage-controlled conductance-variable voltage-to-current converters each having an input, output and control input, the outputs of said first and second converters being coupled to the input and output of said variable resistor means, respectively, and the control inputs of said first and second converters being coupled to said second coupling means; and first and second subtractors each producing a difference voltage between voltages at the input and the output of said voltage-controlled variable resistor means, the difference voltages produced by said first and second subtractors being opposite in polarity, and said first and second subtractors having outputs coupled with the inputs of said first and second voltage-to-current converters, respectively.

5. A generator for generating a control voltage waveform whose waveform varies from a first voltage level to a second voltage level depending on a first time constant, from the second voltage level to a third voltage level depending on a second time constant, and from the third voltage level back to the first voltage level depending on a third time constant, comprising:

a voltage-controlled variable resistor means with input, output and control input, the resistance between the input and the output of said variable resistor means depending on a voltage level at the control input;

a storage capacitor means connected with the output of said voltage-controlled variable resistor means for forming a time constant circuit together with said voltage-controlled variable resistor means and for providing said control voltage waveform;

first voltage signal sources for providing first, second and third voltage level signals;

second voltage signal sources for providing first, second and third time constant determining voltage signals;

first coupling means connected between said first voltage signal sources and the input of said voltage-controlled variable resistor means for sequentially coupling the first, second and third voltage level signals to the input of said voltage-controlled variable resistor means; and second coupling means coupled between said second voltage signal sources and the control input of said voltage-controlled variable resistor means for sequentially coupling the first, second and third time constant determining voltage signals to the control input of said voltage-controlled variable resistor means in synthronism with said first coupling means.

6. A generator according to claim 5, in which said first voltage signal sources each having a dc voltage source and a potentiometer connected across said dc voltage source.

7. A generator according to claim 5, in which said second voltage signal sources each have a dc voltage source and a potentiometer connected across said dc voltage source.

8. A generator according to claim 5, in which said voltage-controlled variable resistor means includes first and second voltage-controlled conductance-variable voltage to-current converters each having an input, output and control input, the outputs of said first and second converters being coupled to the input and output of said variable resistor means, respectively, and the control inputs of said first and second converters being coupled to said second coupling means; and first and second subtractors each producing a difference voltage between voltages at the input and the output of said voltage-controlled vairable resistor means, the difference voltages produced by said first and second subtractors being opposite in polarity, and said first and second subtractors having outputs coupled with the inputs of said first and second voltage-to-current converters, respectively.

9. A generator for generating a control voltage waveform whose waveform varies from a first voltage level to a second voltage level representing the peak level of the envelope depending on a first time constant, from the second level to a third voltage level depending on a second time constant, and from the third voltage level back to the first voltage level depending on a third time constant, comprising:

a voltage-controlled variable resistor means with input, output and control input, the resistance between the input and the output of said variable resistor means depending on a voltage level at the control input;

a storage capacitor means connected with the output of said voltage-controlled variable resistor means for forming a time constant circuit together with said voltage-controlled variable-resistor means and for providing said control waveform signal;

first voltage signal sources for providing first, second and third voltage level signals;

second voltage signal sources for providing first, second and third time constant determining voltage signals;

first coupling means connected between said first voltage sources and the input of said voltage-controlled variable resistor means;

second coupling means connected between said second voltage source and the control input of said voltage-controlled variable resistor means;

instruction signal generating means for generating an instruction signal to form said control waveform signal;

comparing means for comparing the second voltage level and a voltage level stored in said storage capacitor; and means responsive to said instruction signal generating means and said comparing means for causing said first coupling means to sequentially couple the first, second and third voltage level signals to the input of said voltage-controlled variable resistor means and causing said second coupling means to sequentially couple the first, second and third time constant determining voltage signals to the control input of said voltage-controlled variable resistor means in synchronism with said first coupling means.

10. A generator according to claim 9, in which said first voltage signal sources each include a dc voltage source and a potentiometer connected across said dc voltage source.

11. A generator according to claim 9, in which said second voltage signal sources each include a dc voltage source and a potentiometer connected across said dc voltage source.

12. A generator according to claim 9, in which said voltage-controlled variable resistor means includes a first and second voltage-controlled conductance-variable voltage-to-current converters each having an input, output and control input, the outputs of said first and second converters being coupled to the input and ouput of said variable resistor means, respectively, and the control inputs of said first and second converters being coupled to said second coupling means; and first and second subtractors each producing a difference voltage between voltages at the input and the output of said voltage-controlled variable resistor means, the difference voltages produced by said first and second subtractors being opposite in polarity, and said first and second subtractors having outputs coupled with the inputs of said first and second voltage-to-current converters, respectively.

* * * * *